(12) United States Patent
Ho

(10) Patent No.: US 6,657,124 B2
(45) Date of Patent: Dec. 2, 2003

(54) ADVANCED ELECTRONIC PACKAGE

(75) Inventor: Tony H. Ho, 11F-2, No. 171, Wulin Rd., Hsinchu City (TW)

(73) Assignee: Tony H. Ho, Hsinchu (TW)

( * ) Notice: Subject to any disclaimer, the term of this patent is extended or adjusted under 35 U.S.C. 154(b) by 77 days.

(21) Appl. No.: 10/086,223

(22) Filed: Mar. 1, 2002

(65) Prior Publication Data

US 2002/0079577 A1 Jun. 27, 2002

Related U.S. Application Data

(63) Continuation-in-part of application No. 09/453,442, filed on Dec. 3, 1999, now abandoned.

(51) Int. Cl.[7] .............................................. H01L 23/02
(52) U.S. Cl. ..................... 174/52.4; 257/738; 257/780; 257/690
(58) Field of Search ................................ 257/737, 738, 257/780, 690; 174/52.4

(56) References Cited

U.S. PATENT DOCUMENTS 5,598,036 A * 1/1997 Ho .............................. 257/738

* cited by examiner

Primary Examiner—Hung V. Ngo
(74) Attorney, Agent, or Firm—Rosenberg Klein & Lee

(57) ABSTRACT

The present invention includes a semiconductor package that forms a solder array joints on the die surface and their corresponding PCB respectively. The life times of array solders are increased through use of two set of array joints that have high and low melting points. The high melting solders are served as the dummy ones to sustain the overall stand-offs of array joints. The solder size in the same solder array is identical. The melting solders with high and low melting points implemented on a semiconductor die are heading one to one attached to the correspondingly melting solders of high and low melting points in PCB site. The reflow temperature of smt assembly is between the aforementioned high and low melting points. In addition, the solder joints with directional properties are made so as to make the fanout connections on PCB site.

16 Claims, 15 Drawing Sheets

ADVANCED ELECTRONIC PACKAGE

REFERENCE TO RELATED APPLICATION

This Patent Application is a Continuation-in-Part of patent application Ser. No. 09/453,442, filed Dec. 3 1999, now abandoned.

FIELD OF INVENTION

The present invention is related to an electronic package in general, and in particularly to an in-line process of PCB assembly with solder array joints.

BACKGROUND OF THE INVENTION

The package technology keeps on improving day by day, by using "light, thin, short and small" as design criteria in accordance with the application of tele/communication in the light of heat dissipation through dense array packages such as Ball Grid Array (BGA), Flip Chip and Chip Scale Package (CSP) are widely applied into commercial semiconductors. Following the matured wafer technology of Known Good Die (KGD), a kind of direct chip attachment technology makes array joints growing on the pads of dice to be installed onto the PCB. This has been regarded as the most dazzling "bright-star products" in the future according to packaging experts.

Nevertheless, there are existing some problems nowadays as listed in below:

1. The stand-off of the solder joints is too small to sustain the thermal stress which was generated from reflow process. The resolution so far is to fill with the underfill between dice and the substrate to reduce the induced thermal impacts as well as to increase the life times of solder joints.
2. The addition of underfill is a bottleneck to PCB assembly. Even, they are hard to repair after they had been filled with the underfill.
3. BGA also faces the reliability controversy resulted from insufficient stand-offs of solder joints. As the solder pitch keeps in getting smaller, the stand-off of a BGA, or a Flip Chip is proportionally reduced with the shrinkage of solder pitch, from regular 1.27 mm down to 0.8 mm or even goes below 0.5 mm.
4. As the wafer's manufacturing technology keeps on stepping forward, the design principle of "light, thin, short and small" can be achieved through the array solders that are implemented on a semiconductor die or on a BGA substrate. Still, under cost-effective consideration, the layers of PCB are not able to increase enough for functional purposes accordingly. In other words, the connections between a die and the corresponding PCB or a BGA substrate have to rely on their circuit layouts through the fanout of a BGA substrate or by PCB. At this moment, the connections between the die-pad and corresponding substrate-pad is almost in 1:1 volume ratio, thereby, there is no resolution for this problem.

To solve the bottleneck problems listed above, the inventions are connecting with conventional Surface Mount Technology (smt) and are illustrated by the followings.

OBJECTIVES AND SUMMARY OF THE INVENTION

The primary objective of present invention is to provide the reliable connections between a semiconductor die and the PCB by forming array joints on both of them so as to make the permanent connections after the reflow process has been completed. In this way, the stand-off of total solder joints can be increased with solid adhesions.

Secondly, the invention is to provide a method of increasing the shearing strengths of array joints that include two sets of melting points and the reflow temperature is between the aforesaid two melting points. The high melting solders are served as the pillars to maintain the stand-off, while, in the mean time, the rest of low melting solders will turn from the barrel-like shapes into the hourglass-like shapes that have better mechanical strengths, after the reflow temperature has been cooled down to room temperature. The high melting solder is defined that they are not melted or distorted at reflow stage while the low melting solders and solder pastes will be melted. The melting point of high melting solders is defined to have 20° C. higher than the reflow temperature, while the melting point of low melting solders is defined to have 20° C. lower than the reflow temperature of smt process.

Finally, the invention is also to provide a method of connecting the semiconductor die and PCB by using array solders with directional properties as to make permanent connections with fanout characteristic.

BRIEF DESCRIPTION OF THE DRAWINGS

To depict in more details, FIG. 1 shows the connections between a Flip Chip and a PCB through the use of solder balls.

FIG. 2 shows the connections between a Flip Chip and a PCB where the solder joints of the die using solder balls while the PCB using solder paste.

FIG. 3 shows the connections between a Flip Chip and a PCB where the solder joints of both a die and PCB using solder paste.

FIG. 4 shows the connections between a BGA and a PCB where the solder joints of a BGA using solder balls while the PCB using solder paste.

FIG. 5 shows the connections between a BGA and a PCB where the solder joints of both a BGA and PCB using solder balls.

FIG. 6 shows the connections between a BGA and a PCB where the solder joints of both a BGA and PCB using solder paste.

To depict in more detail, FIG. 8 shows the connections between a Flip Chip and a PCB where the solder joints of both a dice and a PCB using solder balls.

FIG. 9 shows the connections between a Flip Chip and a PCB where the solder joints of a die using solder balls while the PCB using solder paste.

FIG. 10 shows the connections between a Flip Chip and a PCB where the solder joints of both a die and PCB using solder paste.

FIG. 11 shows the connections between a BGA and a PCB where the solder joints of both a BGA and PCB using solder balls.

FIG. 12 shows the connections between a BGA and a PCB where the solder joints of a BGA using solder balls while the PCB using solder paste.

FIG. 13 shows the connections between a BGA and a PCB where the solder joints of both a BGA and PCB using solder paste.

DETAILED DESCRIPTION OF THE INVENTION

Figure 1:
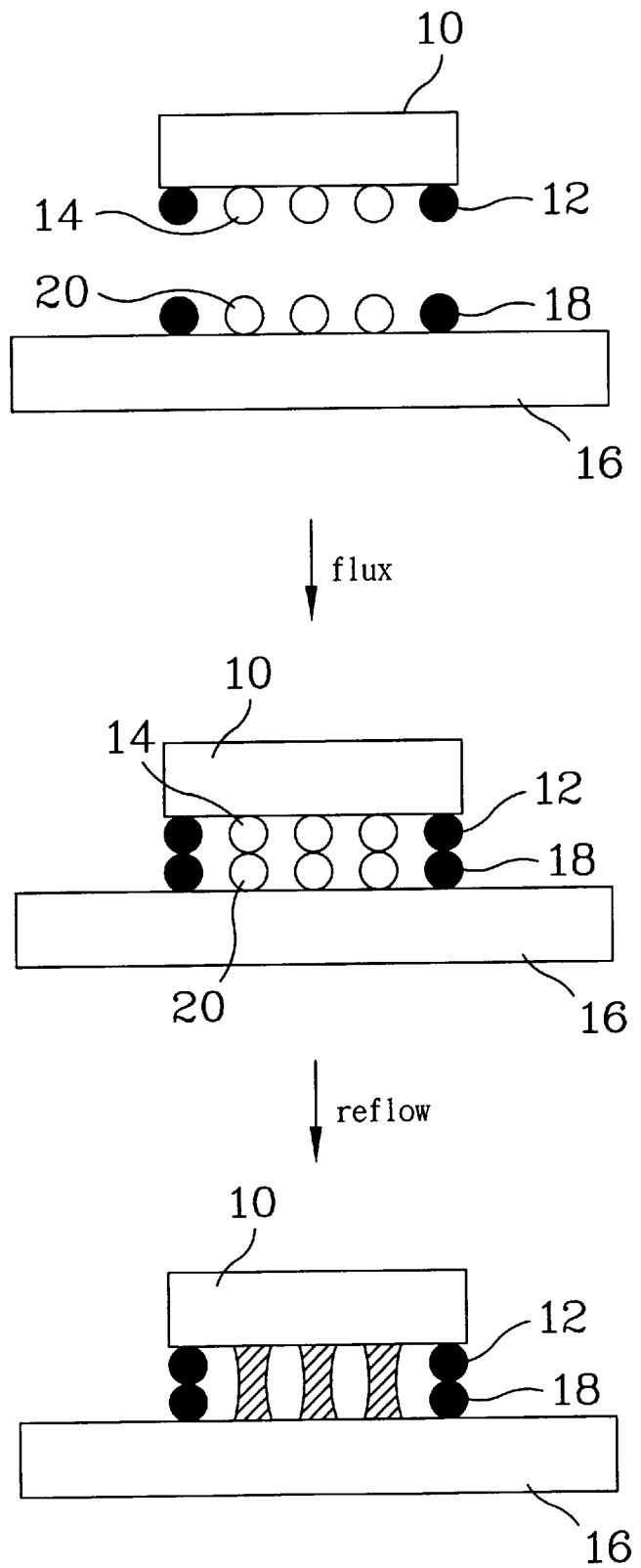
FIGS. 1 to 6 show a plurality of embodiments, which is to use regular solder joints, connecting a semiconductor die and PCB where the array solders of both a semiconductor die and PCB comprise two sets of solder joints having high and low melting points.

A plurality of embodiments is employed to illustrate the scope and characteristic of present invention which mainly comprises two parts. The first part discloses the process by using the solder joints with directional and non-directional properties respectively in order to connect a semiconductor die and PCB. In first part, the former section explains the way to increase the stand-off of array joints while the latter section explains the method to resolve the fanout problem. The second part illustrates an integration of in-line PCB assembly.

The First Part: To Connect a Semiconductor Die and a PCB
I. To Increase the Stand-off of Array Joints First above, illustrate how to resolve the solder connections with DCA, that is the solder connections by Flip Chip, or by BGA, through the use of two sets of array solders.

In regular smt process, the array solders of solder paste and other low melting solders are all melted at reflow stage. They will first collapse, melt into molten state, and are solidified through surface tension of solder pads in connecting a semiconductor die with the PCB. The stand-off of low melting solders will be reduced to 65% to 70% height of barrel ones compared to that of originally circular ones. By using two set of array solders, the high melting solders that will not melt at reflow stage and are served as the pillars to sustain the total stand-off of array joints. Hence, the good mechanical strengths of hourglass-like solders can be formed to increase the life times of solder joints. More importantly, the reliabilities of solder joints are greatly increased that the additions of underfill can thus be skipped.

Three more characteristic properties regarding high melting solders are discussed. First, they are not the soft materials which can absorb the thermal stress exerted by reflow process, actually, after the formation of preliminary cure, the high melting solders are not distorted and act like hard materials as the heating temperature was cooled down to room temperature. Hence, the high melting solders are served as the pillars to sustain the standoff of array joints that make the rest of the low melting solders form into the hourglass shapes which had been proven to have better mechanical strength than barrel ones.

Second, on the other hand, the high melting solders are not suitable to be installed in the region of stress concentrations such as the array joints at peripheral rows or in the outer rows below die edges. Because they do not melt at reflow stage, the high melting solders of top array and bottom array are only connected by the adhesion of thin solder paste that may be too fragile to pass the further reliability tests. They are only served as the dummy ones. The numbers of high melting solders are limited as long as they can sustain the total stand-offs of array joints. If the high melting solders are to be used into the region of stress concentrations with functional purposes, the upper and bottom part of each solder joint needs to be integrated into a unity for better thermal resistance. The ball size of high melting solders is designed twice the size as that of the low melting solders and are installed either on the top array or on the bottom array only to balance the level of array joints.

Third, according to the design rule of a die layout, the circuit layouts of a die are restricted to locate in the regions of four corners and leave them with blank. Hence, the high melting solders that act as the dummy ones can be implemented at four corners of a die.

FIG. 1 through FIG. 6 show a plurality of embodiments which are using the solder joints with equally 1:1 proportion to connect a semiconductor die with a PCB where the array solders of both a die and a PCB comprise two sets of solder joints that have different melting points.

In FIG. 1, in order to effectively increase the stand-off of solder joints, the solder joints are grown on a die 10 of DCA and a PCB. The solder joints 12 and 14 comprise two sets of melting points. Meantime, the array joints are implemented onto PCB 16 corresponding to the locations of die 10. They also comprise two sets of solder joints 18 and 20 with different melting points. Through Flip Chip installation, to place the solder joints 12 and 4 onto a die 10 first, then, by adding the appropriate amount of flux or solder paste to temporarily connect with the solder joints of 18 and 20 of PCB 16. After the completion of reflow process, the high melting solders 12 and 18 maintain the predetermined stand-off of total array joints, while the remaining low melting solders 14 and 20 are converted into the hourglass type with relatively high mechanical strength.

Figure 2:
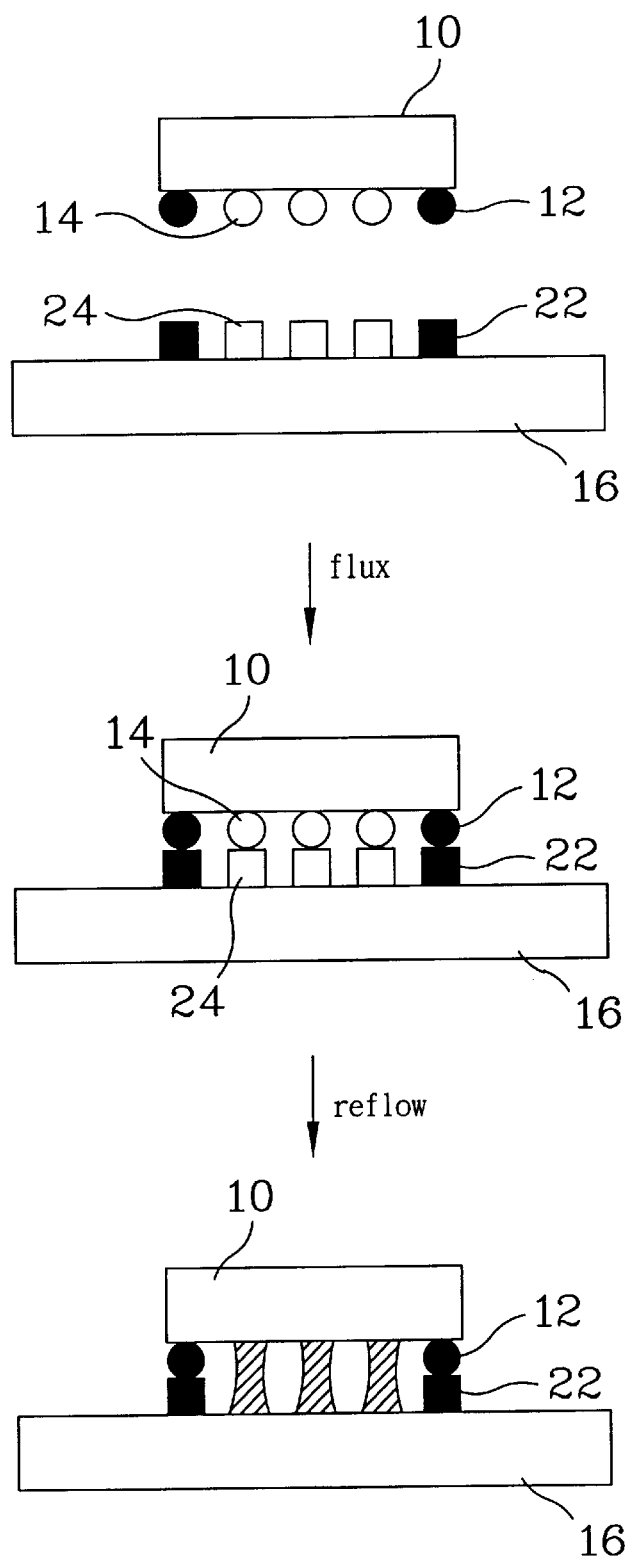
Figure 3:
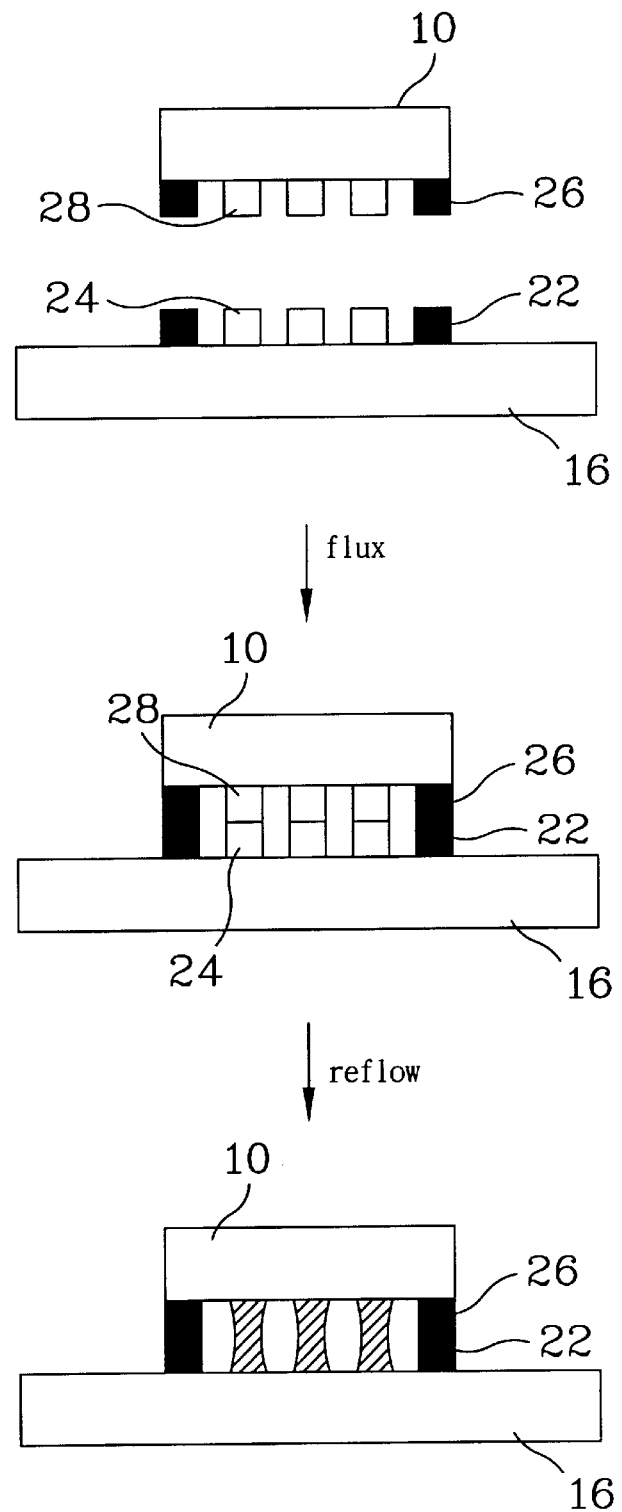

FIG. 2 shows embodiment of the connections between a die 10 and PCB 16 where the solder paste are placed on PCB 16. Similarly, they also comprise two sets of solder pastes 22 and 24 with different melting points, the former ones have high melting point while latter ones have low melting point. FIG. 3 is another embodiment where solder paste 26 and 28 are used for the solder joints of a die 10.

There are different methods that can be employed to install the solder joints onto PCB 16, for instance, such as stencil printing, solder injection, ink jet plating, solder jetting and electroplating.

Regarding solder alloys, for Sn—Pb alloy, the eutectic solder using 63% Sn 37% whose melting temperature is 183° C. and is employed as the solder of low melting point. The reflow temperature is performed between 220° C. and 240° C. The high melting solders that use the high Lead contents (above 70%) whose melting point can reach 300° C. or even higher. For Lead free solder alloys, such as Sn—Cu, Sn—Ag—Bi, Sn—Bi, and Sn—Zn etc. The low melting ones whose melting temperature are approximately defined below 240° C. while their reflow temperature may be located around 260° C. The high melting solders whose melting point may reach above 300° C. to ensure that they are not melted at reflow stage by filling more metal contents other than Tin.

Figure 4:
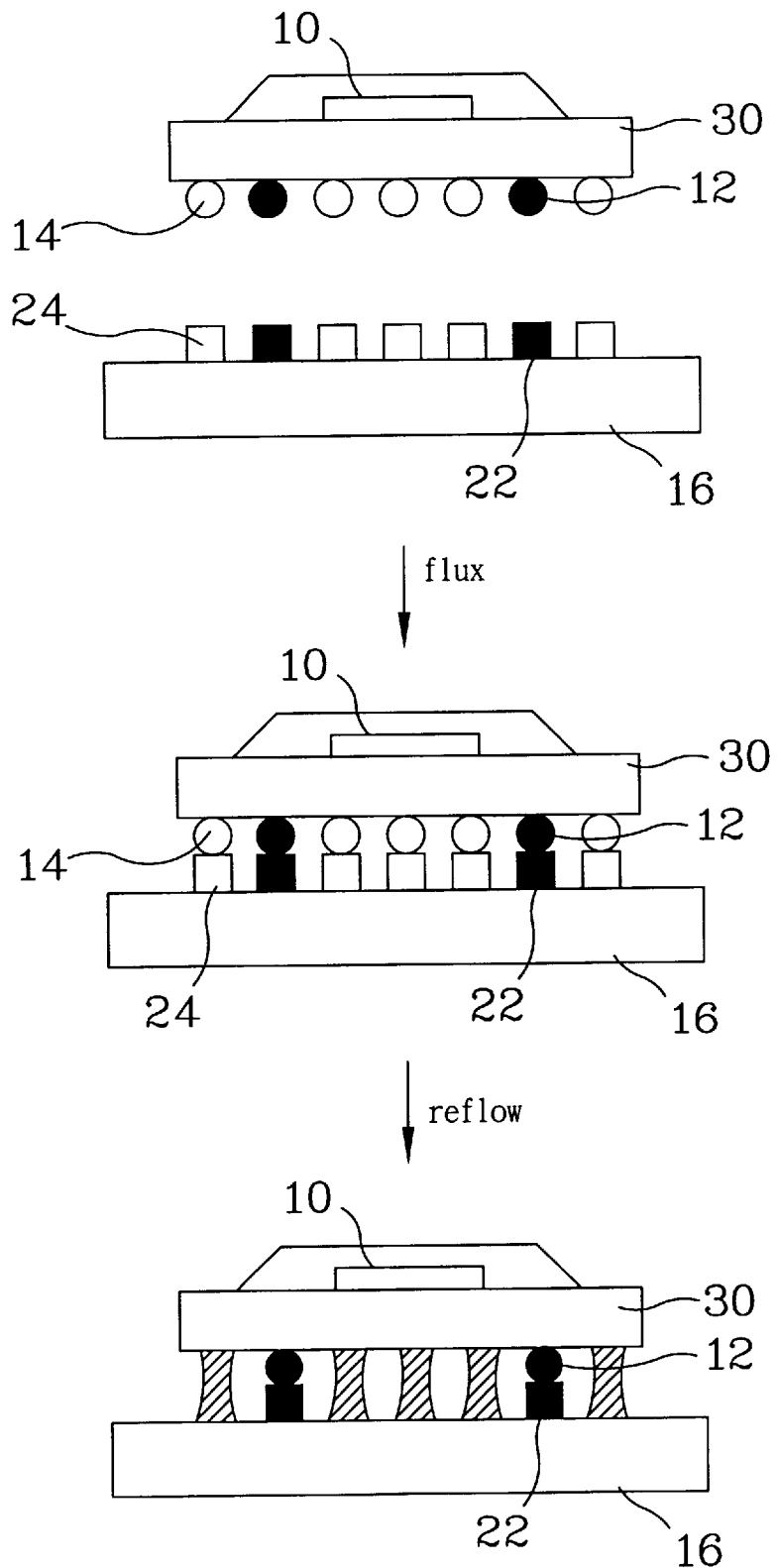
Figure 5:
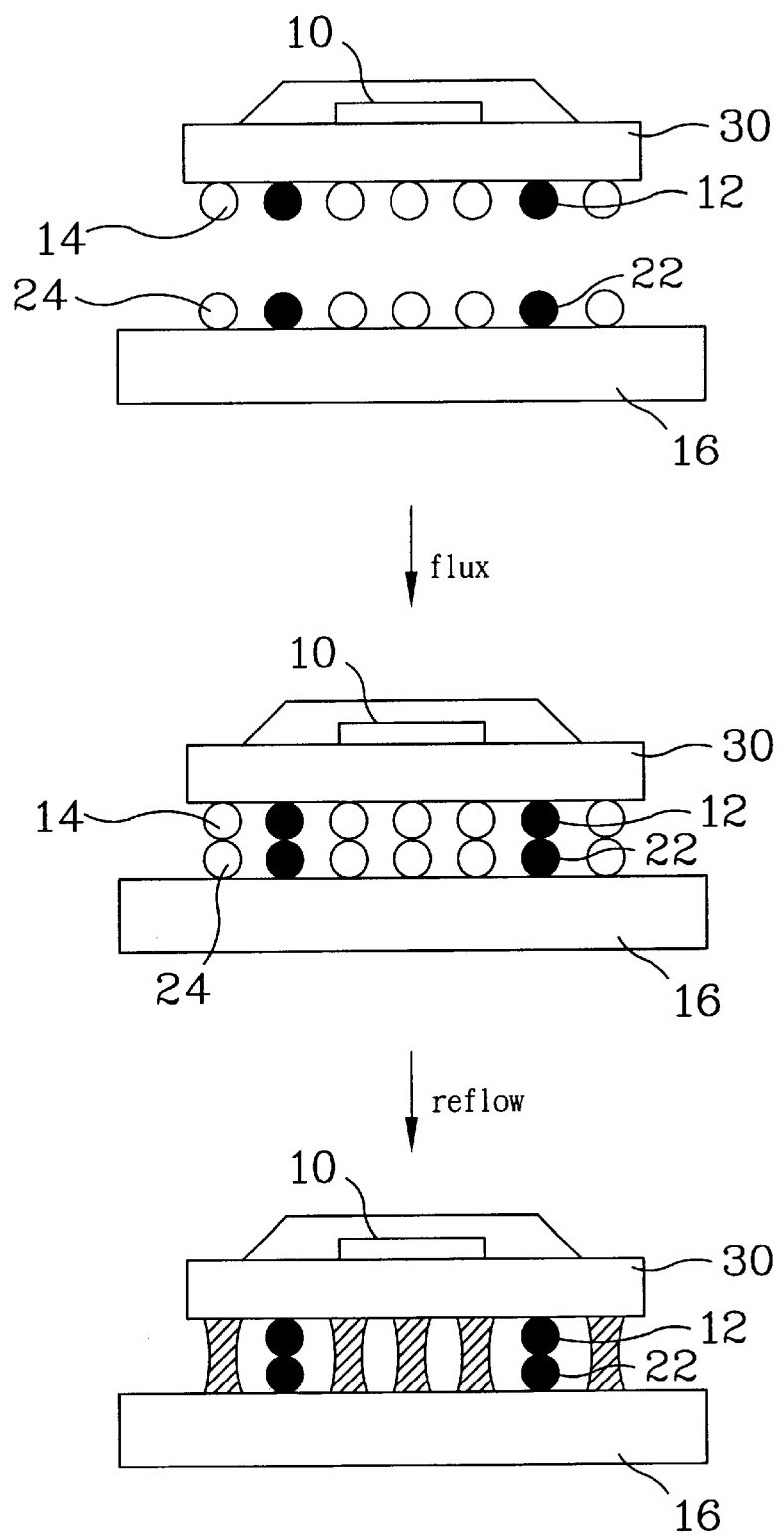
Figure 6:
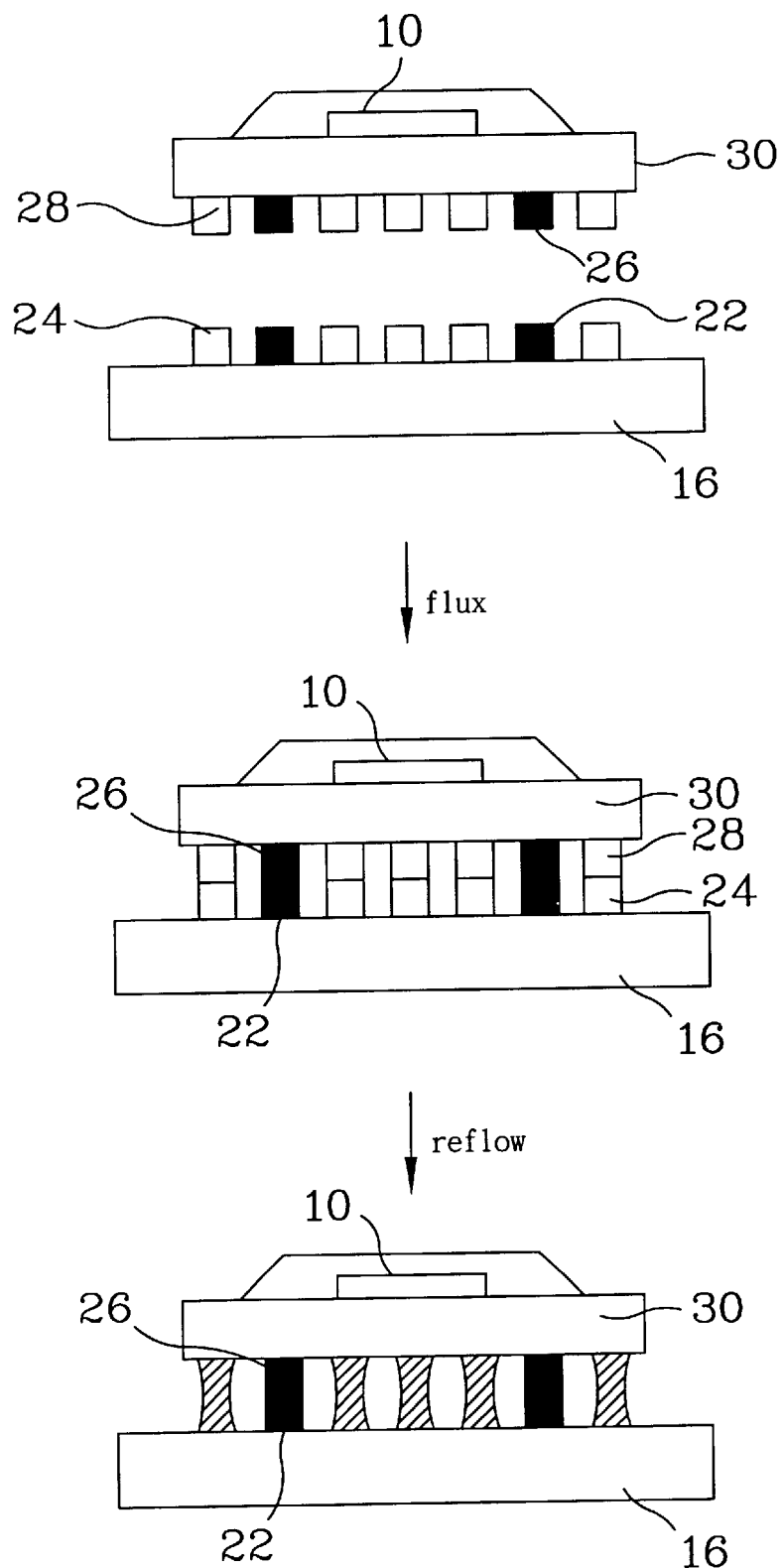

In the foregoing embodiments of FIG. 1, FIG. 2, and FIG. 3, Flip Chip process that installs a die 10 directly onto PCB are employed. In FIG. 4, FIG. 5 and FIG. 6, the BGA assembly is being used to attach a die 10 indirectly with PCB 16. Inside the BGA structure, the die assembly can use wire bonds, or Flip Chip, or tape automated bonding (TAB) or two of them together.

The life times of solder joints are strongly related to the solder height that is proportional to the solder pitch of a BGA substrate or a PCB. The total stand-offs of solder joints are increased by adding the stand-off of top joints and the stand-off of bottom joints together. However, under cost-effective considerations, if the solder pitch is larger than a criterion such as 0.8 mm, it is not necessary to implement the array joints on either the top surface of a BGA substrate or that of the PCB. Also, only one of the low melting solders is being used in the BGA structure discussed above.

II. Fanout

We hereof continue to illustrate how to connect a die with a substrate, or a die with PCB that has the fanout layout by using the solder joints with directional properties.

Figure 7:
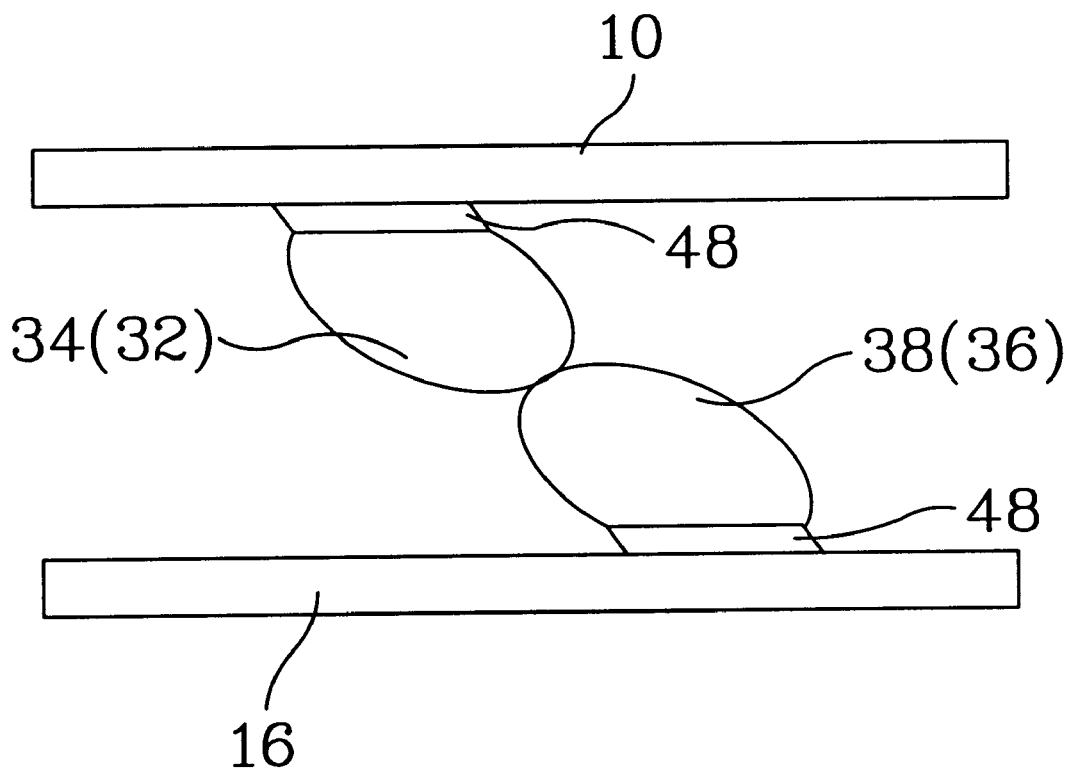
FIG. 7 shows the solder joints with directional properties. The solder openings of top surface and bottom surface have the solder angles that were calculated before in order to make directional joints.
Figure 8:
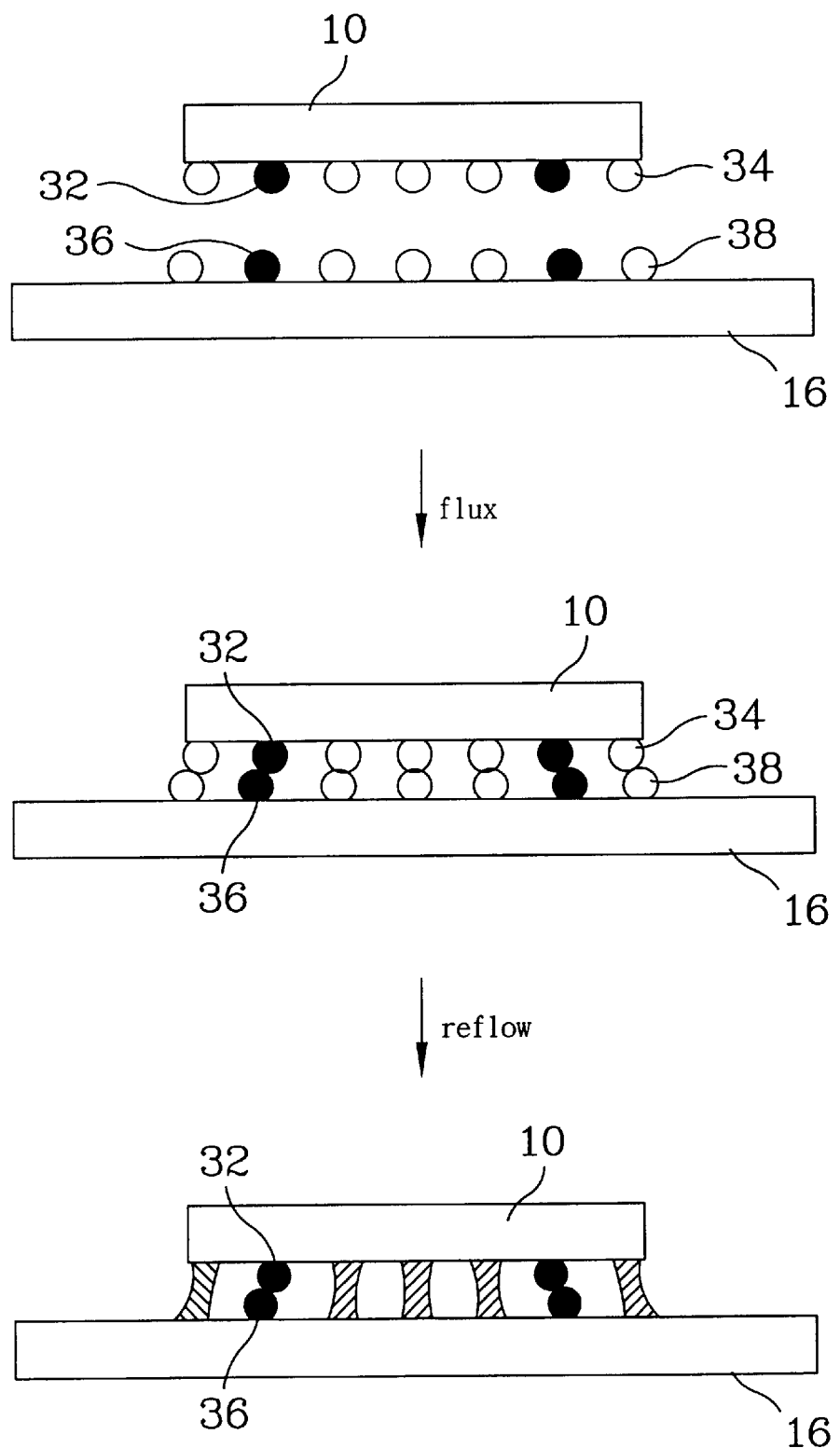
FIGS. 8 to 13 show a plurality of embodiments which by using array solders with directional properties where the array solders of both a semiconductor die and the PCB comprise two sets of solder joints having different melting points.
Figure 9:
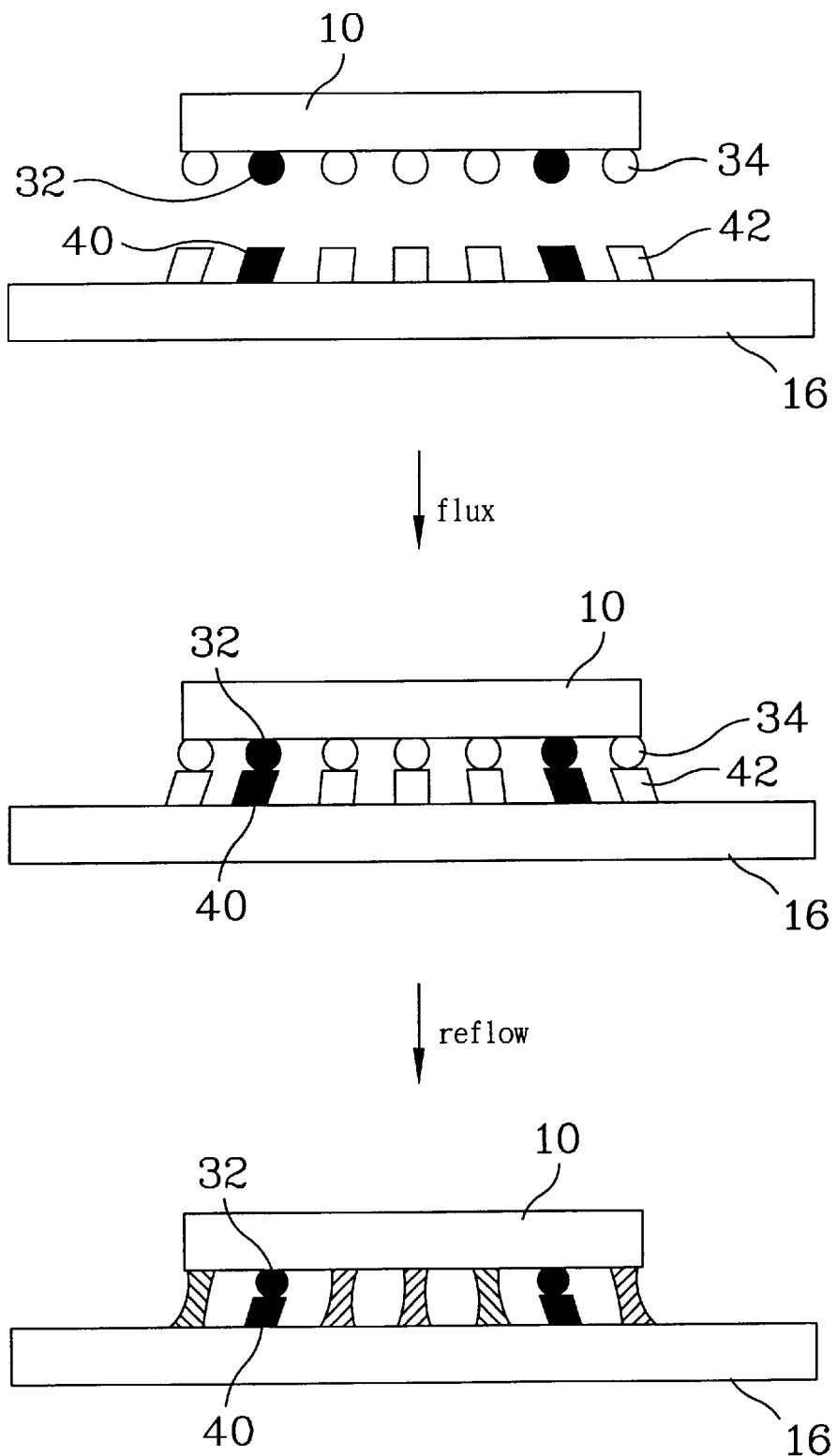
Figure 10:
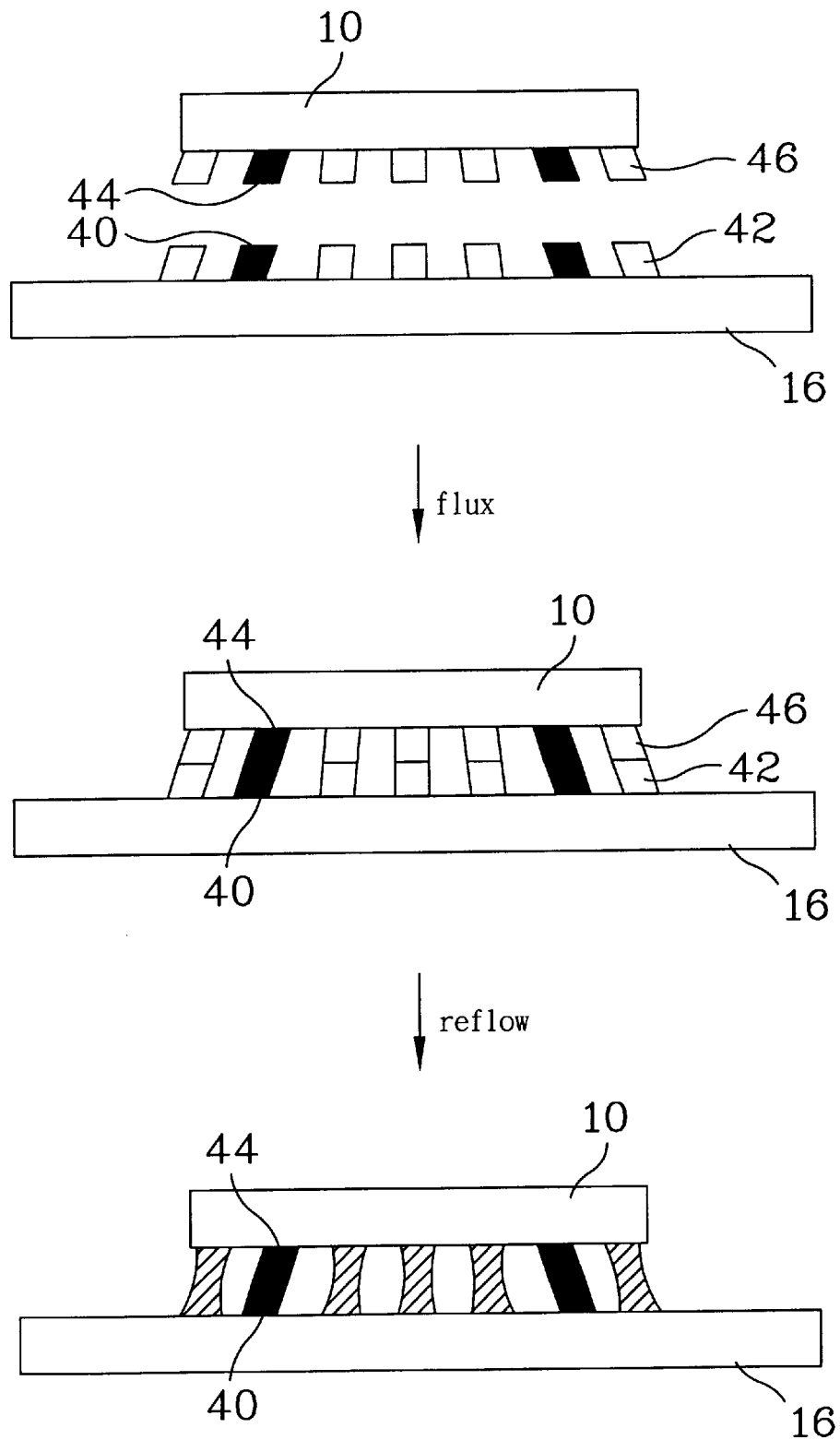
Figure 11:
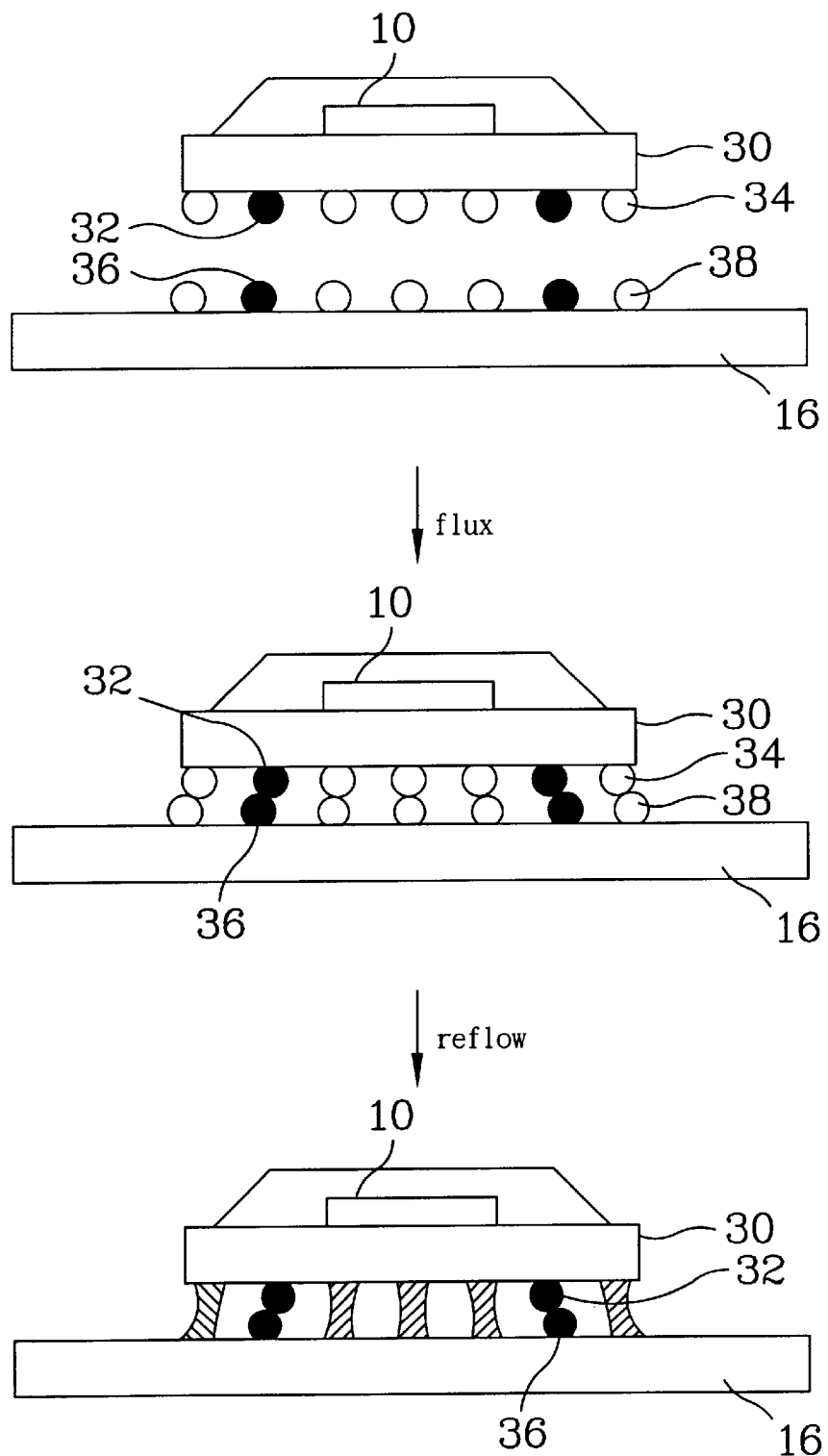
Figure 12:
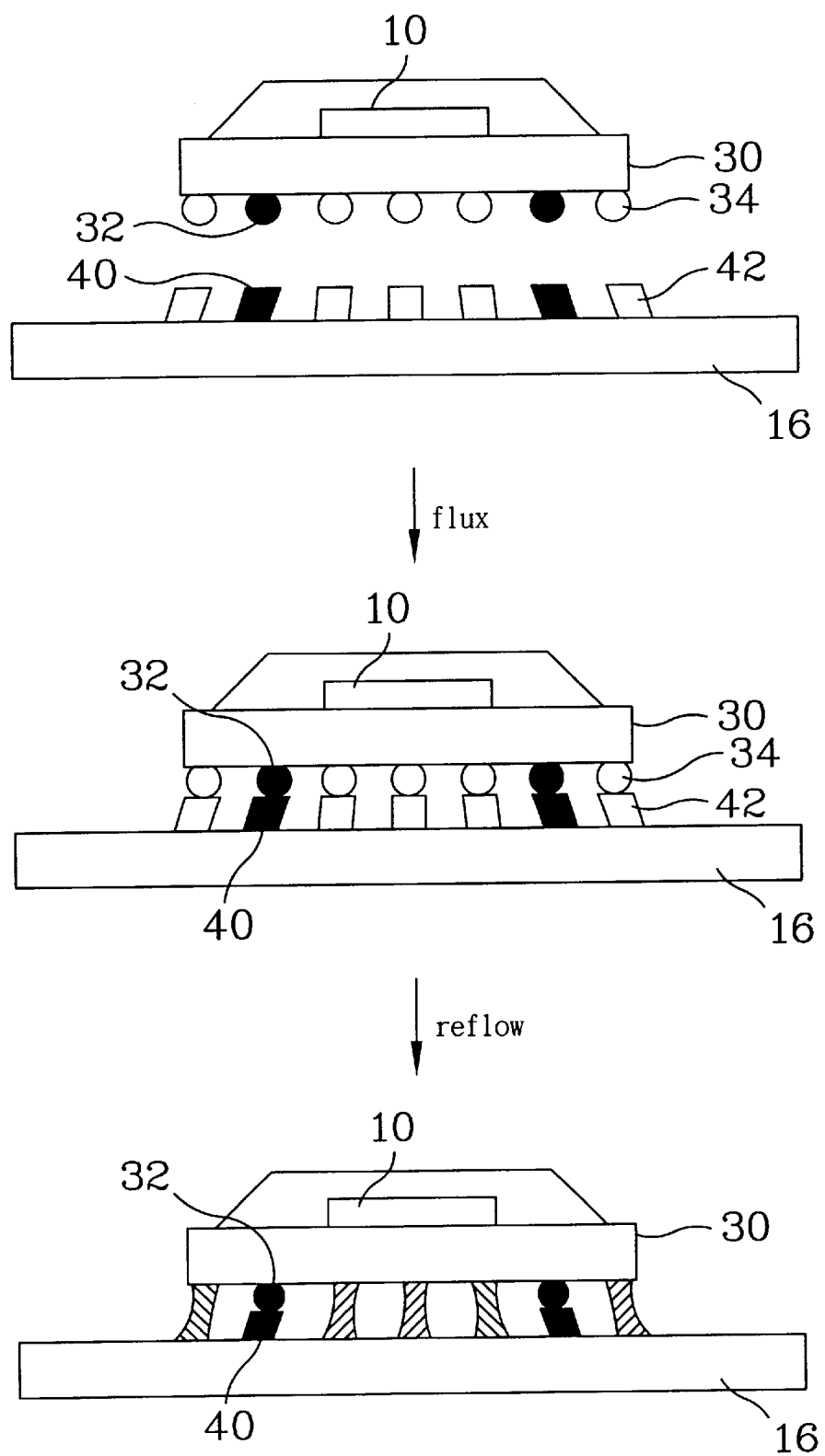
Figure 13:
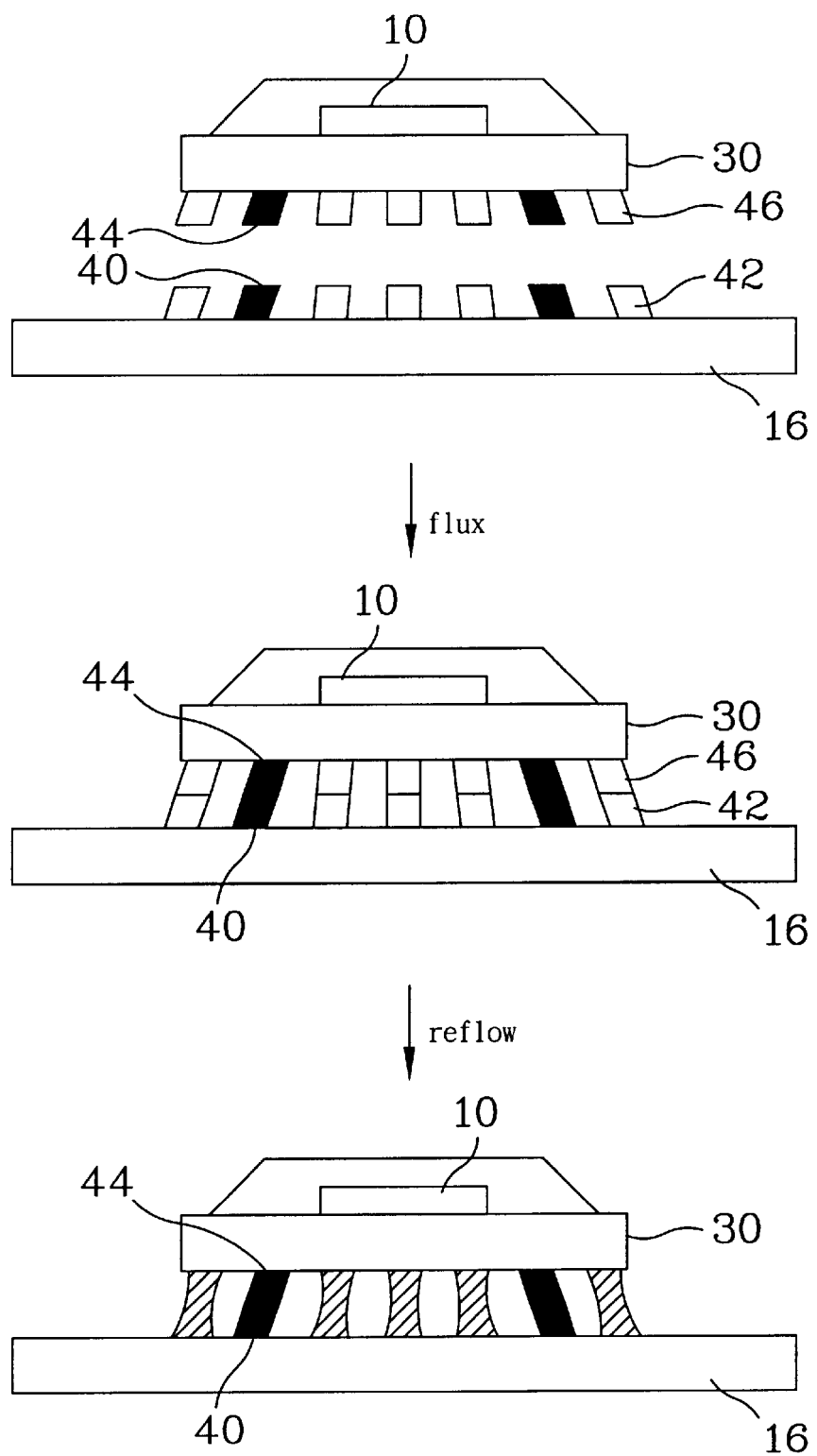

As the manufacturing process of wafer technology keeps on improving, the input/output density of the chip is getting higher while the chip size is getting smaller. Accordingly, the substrate layers of the PCB have to be adjusted to a multi-layer so as to maintain equally 1:1 proportional (or) connections between a die and the PCB. Under cost-effective consideration, the fanout connections are proposed. As shown in FIG. 7, the openings of solder pads 48 on both a die 10 and PCB 16 are designed to have directional properties so as to form the joints with directional properties. The directional angles of solder openings were calculated before. The placements of solder joints 34/38(32/36) and consecutive reflow process are identical with the foregoing embodiments discussed earlier.

After reflow process, the solder joints on a die 10 and solder joints on PCB 16 are formed together into radial interconnections which are similar to conventional wire bonds. The connections are firmly fixed through the surface tensions exerted by solder pads of a die 10 and PCB 16. As long as the adjacent solders do not cause short, the solder connections are OK, since solder joints have the magic characteristic of self-alignment. FIG. 8 through FIG. 13 furnish six embodiments which are the same as the ones shown in FIG. 1 through FIG. 6, except the solder joints between a die 10 and PCB 16 are the ones with directional properties. The solder joints 32/34, 36/38 and solder paste 40/42, 44/46 possess directional properties, as the solder pitch of a PCB 16 is greater than that of a die.

(The second part) In-line SMT process

The in-line PCB assembly will be illustrated hereof. The IC assembly in the future can utilize the integrated operations of array joints with PCB through BGA and Flip Chip, thereby, the traditionally package assembly can be skipped. The integrated operations from KGD test to the final connections with PCB can be achieved.

Figure 14:
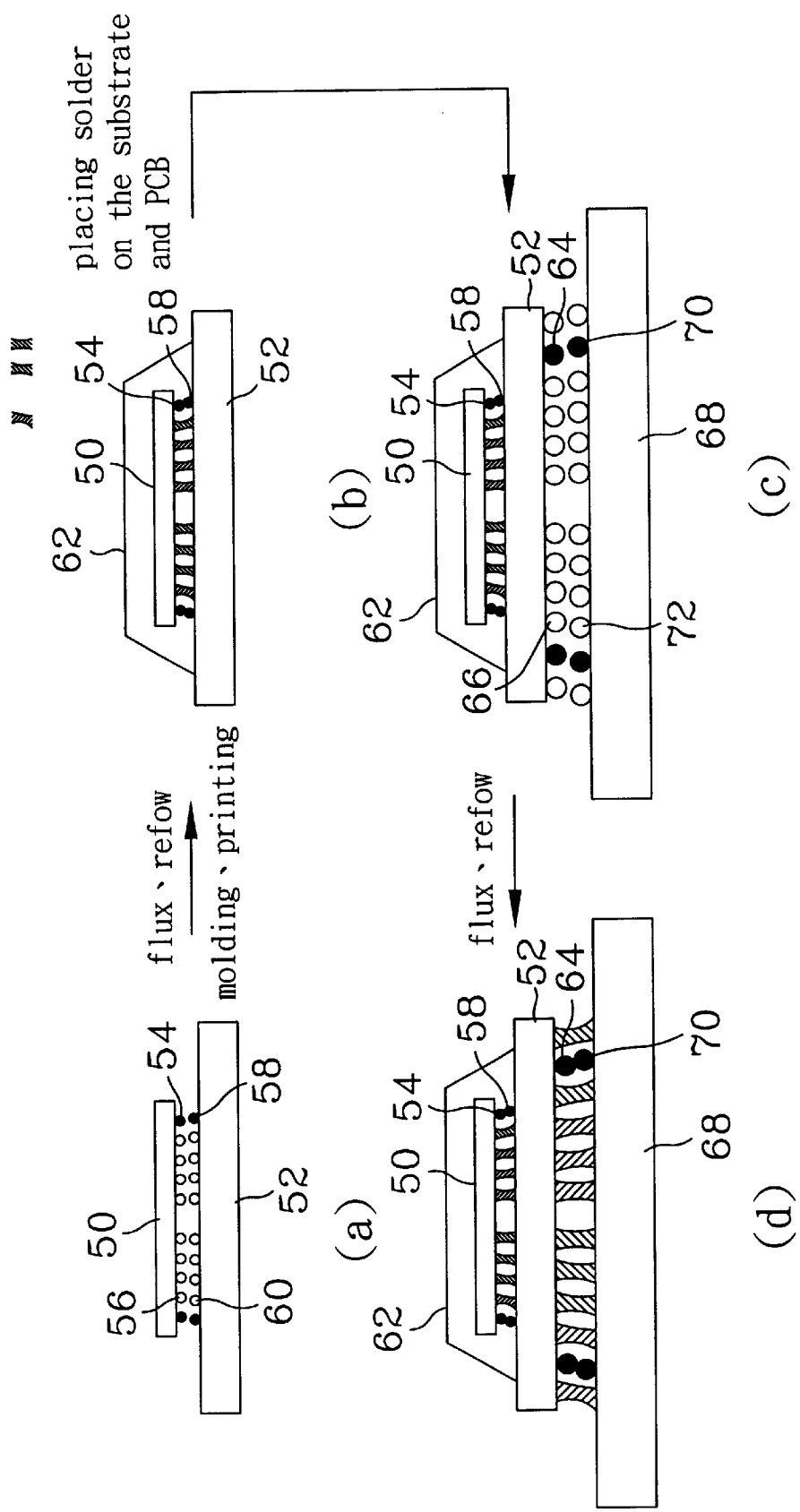
FIG. 14 is a schematic diagram of in-line IC assembly.

As shown in FIG. 14(a), said die 50 is connected with the substrate 52 by Flip Chip process. High melting solders 54 and low melting solders 56 are formed on the die 50, the corresponding high melting solder paste 58 and the solder paste 60 of low melting point are formed on the surface of said substrate 52. These solder joints possess directional properties, they then moisten with flux and finally to form permanent connections with PCB through reflow process. Thereafter, apply epoxy of molding compound 62 (EMC) through epoxy printing process as shown in FIG. 14(b). In FIG. 14(c), high melting solders 64 and low melting solders 66 are formed on the surface of said substrate 52, while the corresponding high melting solder paste 70 and low melting solder paste 72 are formed on the surface of PCB 68. These solder joints possess directional properties too. They then moisten with flux and through reflow process to form permanent connections as shown in FIG. 14(d).

Figure 15:
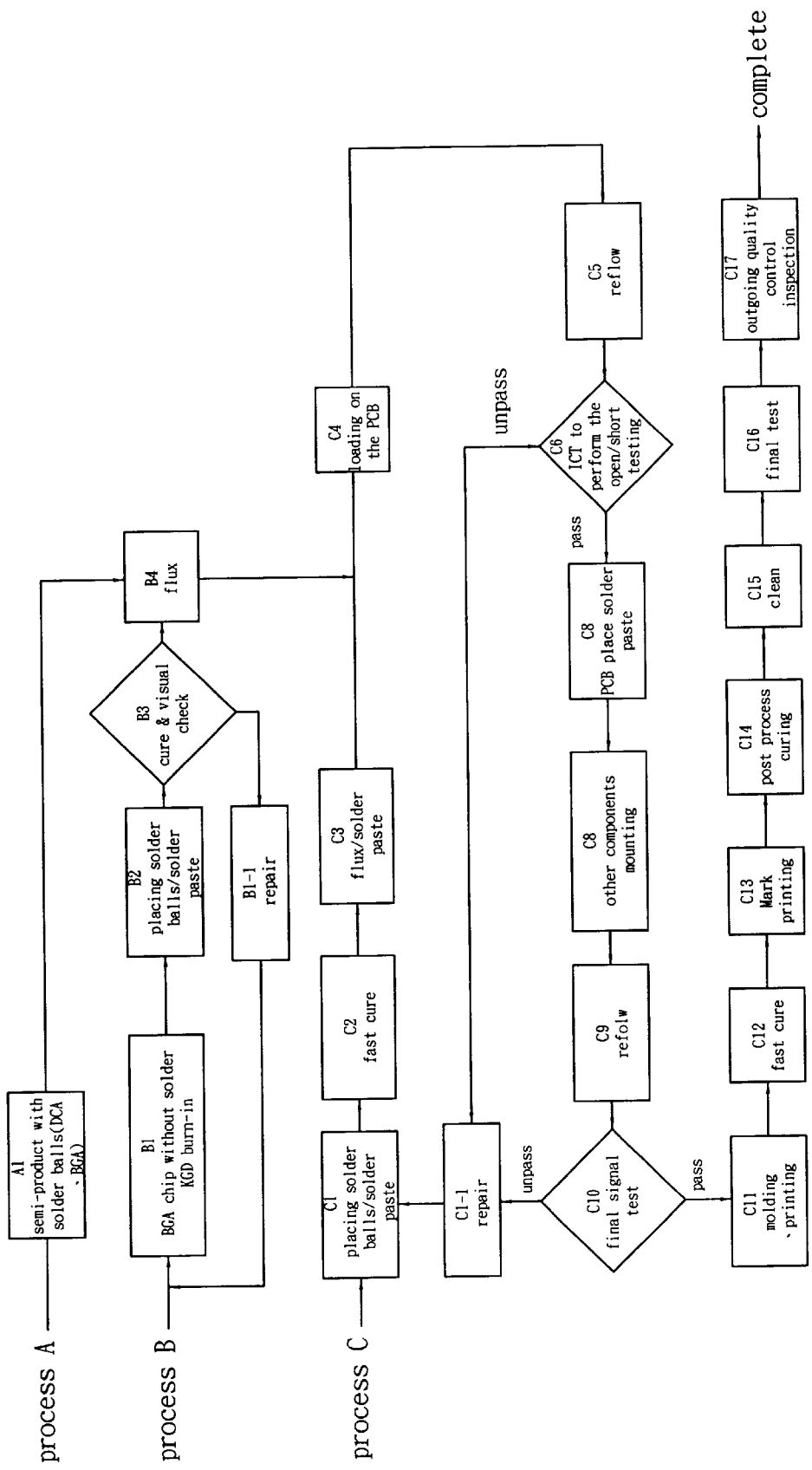
FIG. 15 is a whole schematic diagram of an in-line PCB assembly.

FIG. 15 provides an in-line PCB assembly. The process C is the principal process comprises seventeen smt processes. Process yields the semi-products of Flip Chip that have already been tested for the consecutive PCB assembly. Process B yields the semi-products of BGA first, then, through reflow process to complete the PCB assembly.

The in-line process can also be connected continuously from the beginning of wafer' manufacturing process.

In process C, the seventeen in-line processes are explained as the followings:

Step C1: (i) the array joints are added onto the corresponding PCB, (ii) the thin solder paste or solders flux is added on the top joints of PCB through the process of screen printing.

Step C2: through fast cure, the original solder joints are formed.

Step C3: the solders flux or solder paste is added on the designated locations of solder joints of PCB through screen printing.

Step C4: the array solders of a die or a BGA substrate are heading one-to one contact to the corresponding array solders of PCB through the addition of thin solder paste.

Step C5: to form permanent connections of a semiconductor die with PCB through reflow process.

Step C6: to perform the ICT (in circuit test) on IC components. The IC components that did not pass the ICT are sent back to Process C to repair, thereafter, repeat the following process.

Step C7: to place solder paste on the corresponding PCB locations.

Setp C8: to mount the needed IC components onto the corresponding pads of PCB, then, add thin solder paste or solder flux on their top surfaces.

Step C9: to perform permanent connections through reflow process.

Step C10: to perform functional tests or the open/short tests for the IC components that have already been mounted onto PCB.

Step C11: by drop jelly method using flip jelly or through stamping process of printing to infuse the stamping jelly onto IC components in order to further protect the IC package or to be ready for top side marks of EMC printing.

Step C12: to fix the stamping jelly through fast cure.

Step C13: to perform the printings of top side mark.

Step C14: post cure process.

Step C15: to clean the residual flux or solder paste left.

Step C16: to perform the final tests with PCB attached.

Step C17: to perform the inspections of outgoing quality control (OQC), then, perform the aging test of the PCB systems before the finished products are shipped to customers.

What is claimed is:

1. A semiconductor packaging structure comprising:

an electrically mechanically stressed substrate having a top surface and a bottom said surface;

a region of stress concentrations and a region of electrical dummy within substrate;

a semiconductor die mounted on said top surface;

means, attached on said top surface for electrically contacting selected areas on said die;

a first plurality of solder joints mounted on said die surface, integral with said top surface and projecting downwardly, therefrom, positioned so as to underlie said region of electrical dummy;

a second plurality of solder joints mounted on said die surface, integral with said top surface and projecting downwardly, therefrom, having a lower melting point than said first plurality of solder joints and arranged as a ball grid array over said die surface, excepting locations occupied by said first plurality of solder joints, said region of stress concentrations comprising said second plurality of solder joints; and selected areas on the surface of said top surface that is attached to said die surface, said selected areas comprising cured solder paste and being positioned in one-to-one correspondence with the totality of solder joints on said die surface.

2. The structure described in claim 1 further comprising:
a third plurality of solder joints located on said top surface, comprising the same material as said first plurality of solder joints that is attached to said die surface, in one-to-one correspondence with said first plurality of solder joints;
a fourth plurality of solder joints located on said top surface, comprising the same material as said second plurality of solder joints and arranged as a regular array over said top surface, in one-to-one correspondence with said second plurality of solder joints, excepting locations occupied by said third plurality of solder joints; and
said ball grid array on said die surface, integral with said regular array on said top surface, at integral process, predetermined the shape of said solder joints, said first plurality of solder joints were not melted, and said second plurality of solder joints were melted.

3. The structure described in claim 1 further comprising:
a print circuit board underlying said substrate and attached thereto by means of solder joints;
a fifth plurality of solder joints mounted on said bottom surface, comprising the same material as said first plurality of solder joints, integral with said print circuit board and projecting downwardly;
a sixth plurality of solder joints mounted on said bottom surface, comprising the same material as said second plurality of solder joints, integral with said print circuit board and projecting downwardly, and arranged as a ball grid array over said bottom surface, excepting locations occupied by said fifth plurality of solder joints; and
selected areas on the surface of the print circuit board that is attached to said bottom surface, said selected areas comprising cured solder paste and being positioned in one-to-one correspondence with the totality of solder joints on said bottom surface.

4. The structure described in claim 1 further comprising:
a seventh plurality of solder joints implemented on said print circuit board, comprising the same material as said first plurality of solder joints that is attached to said bottom surface, in one-to-one correspondence with said fifth plurality of solder joints;
an eighth plurality of solder joints implemented on said print circuit board, comprising the same material as said second plurality of solder joints and arranged as a regular array over said print circuit board, in one-to-one correspondence with said sixth plurality, excepting locations occupied by said seventh plurality of solder joints; and
said ball grid array on said bottom surface, integral with said regular array on said print circuit board, at integral process, predetermined the shape of said solder joints, said first plurality of solder joints were not melted, and said second plurality of solder joints were melted.

5. The structure described in claim 1 wherein the solder array of said die, integral with the solder array on said top surface of said substrate using flip chip technology.

6. The structure described in claim 1 wherein said substrate is functioned as said print circuit board to contact with said die for electrical integrals.

7. The structure described in claim 1 wherein each ball size implemented on said die surface is identical, while each ball size implemented on said top surface of said substrate is identical.

8. The structure described in claim 1 wherein each ball size implemented on said bottom surface of said substrate is identical, while each ball size implemented on said print circuit board is identical.

9. The structure described in claim 1 wherein said semiconductor package had been assembled, said first plurality of solder joints were not melted, and said second plurality of solder joints were melted.

10. The structure described in claim 1 wherein said region of stress concentrations comprising second plurality of solder joints that are located underneath die edges at said bottom surface of said substrate.

11. The structure described in claim 1 wherein said region of stress concentrations comprising second plurality of solder joints that are located at peripheral rows of said die surface.

12. The structure described in claim 1 wherein said first plurality of solder joints are implemented at four corners of said die surface that said solder joints of first plurality at four corners are served as dummy joints electrically.

13. The structure described in claim 1 wherein the number of semiconductor dies is at least two.

14. The structure described in claim 1 wherein said first plurality of solder joints are implemented in a ground region located at middle plane on said bottom surface of substrate that said solder joints of first plurality at ground region are served as dummy joints electrically.

15. The structure described in claim 1 wherein said solder paste comprising the same material as said second plurality of solder joints.

16. A semiconductor packaging structure comprising:
at least one semiconductor die;
a print circuit board underlying said dies;
a first plurality of solder joints mounted on said die surface, integral with said print circuit board and projecting downwardly;
a second plurality of solder joints mounted on said die surface, integral with said print circuit board and projecting downwardly, and arranged as a ball grid array over said die surface, excepting locations occupied by said first plurality of solder joints;
a print circuit board underlying said semiconductor die and attached thereto by means of solder joints, selected areas on the surface of said print circuit board that is attached to said die surface;
said selected areas comprising cured solder paste and being positioned in one-to-one correspondence with the totality of solder joints on said die surface;
a seventh plurality of solder joints implemented on said print circuit board, in one-to-one correspondence with said first plurality of solder joints; and
an eighth plurality of solder joints implemented on said print circuit board, and arranged as a regular array over said print circuit board, in one-to-one correspondence with said second plurality, excepting locations occupied by said seventh plurality of solder joints.

* * * * *